(12) United States Patent
Wang et al.

(10) Patent No.: US 11,658,239 B2
(45) Date of Patent: May 23, 2023

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Xuemei Wang, Shanghai (CN); Fugang Chen, Shanghai (CN); Yun Xue, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 352 days.

(21) Appl. No.: 16/739,431

(22) Filed: Jan. 10, 2020

(65) Prior Publication Data
US 2020/0251589 A1 Aug. 6, 2020

(30) Foreign Application Priority Data
Jan. 31, 2019 (CN) .......................... 201910097623.8

(51) Int. Cl.
*H01L 29/78* (2006.01)
*H01L 21/8234* (2006.01)
(Continued)

(52) U.S. Cl.
CPC .. *H01L 29/7816* (2013.01); *H01L 21/823481* (2013.01); *H01L 29/0653* (2013.01); *H01L 29/66681* (2013.01)

(58) Field of Classification Search
CPC ......... H01L 29/7816; H01L 21/823481; H01L 29/0653; H01L 29/66681
See application file for complete search history.

(56) References Cited

U.S. PATENT DOCUMENTS

| | | | |
|---|---|---|---|
| 2008/0230855 A1* | 9/2008 | Liaw ............... | H01L 21/823475 257/412 |
| 2013/0164909 A1* | 6/2013 | Taniguchi ......... | H01L 21/76224 438/425 |

(Continued)

FOREIGN PATENT DOCUMENTS

KR 20040059957 A * 10/2004

*Primary Examiner* — Peter Bradford
(74) *Attorney, Agent, or Firm* — Anova Law Group, PLLC

(57) ABSTRACT

The present disclosure provides a semiconductor device and a fabrication method. The semiconductor device includes: a substrate; a first well region in the substrate, having first ions; an isolation layer in the first well region; a second well region and a third well region, formed in the first well region, located respectively on opposite sides of the isolation layer, having second ions with an opposite conductivity type as the first ions, and with a minimum distance from the isolation layer greater than zero; a first gate structure on the second well region and the first well region; a second gate structure on the third well region and the first well region; a barrier gate on the isolation layer, located between the first gate structure and the second gate structure, and having the second ions; and source-drain doped layers in the second well region and the third well region, respectively.

12 Claims, 4 Drawing Sheets

(51) Int. Cl.
 *H01L 29/66* (2006.01)
 *H01L 29/06* (2006.01)

(56) References Cited

U.S. PATENT DOCUMENTS

| | | | |
|---|---|---|---|
| 2014/0197480 A1* | 7/2014 | Han | H01L 29/66666 438/270 |
| 2015/0228771 A1* | 8/2015 | Chen | H01L 29/0821 257/173 |
| 2020/0251589 A1* | 8/2020 | Wang | H01L 21/823481 |

* cited by examiner

SEMICONDUCTOR DEVICE AND FABRICATION METHOD THEREOF

CROSS-REFERENCES TO RELATED APPLICATION

This application claims the priority of Chinese Patent Application No. 201910097623.8, filed on Jan. 31, 2019, the content of which is incorporated herein by reference in its entirety.

TECHNICAL FIELD

The present disclosure generally relates to the field of semiconductor manufacturing and, in particular, to a semiconductor device and a fabrication method thereof.

BACKGROUND

With rapid development of semiconductor manufacturing technologies, semiconductor devices are moving in a direction toward higher component densities and higher integration. Semiconductor devices, as the most basic devices, are widely used. An existing planar device has weak control of a channel current, resulting in short-channel effects and a leakage current, which ultimately affects electrical performance of a semiconductor device.

To improve the breakdown voltage of a semiconductor device, a conventional method proposes a Lateral Drift Metal Oxide Semiconductor (LDMOS). Structures of the LDMOS includes: a first well region and a second well region in a substrate, that the first well region and the second well region have ions with different conductivity types; gate structures on the first well region and the second well region; a source-end doped layer and a drain-end doped layer in the substrate respectively located on opposite sides of the gate structures, that the drain-end doped layer is located in the second well region, the source-end doped layer is located in the first well region, the source-end doped layer and the drain-end doped layer have source-drain ions, and the source-drain ions and the ions in the first well region have a same conductivity type.

However, there is a need to improve performance of the LDMOS device fabricated by the conventional methods.

SUMMARY

One aspect of the present disclosure provides a semiconductor device, including: a substrate; a first well region in the substrate, that the first well region has first ions; an isolation layer in the first well region; a second well region and a third well region, formed in the first well region, that the second well region and the third well region are respectively located on opposite sides of the isolation layer, the second well region and the third well region have second ions, the second ions and the first ions have opposite conductivity types, and a minimum distance of a distance between the second well region and the isolation layer, and a distance between the third well region and the isolation layer, is greater than zero; a first gate structure on the second well region and the first well region; a second gate structure on the third well region and the first well region; a barrier gate on the isolation layer, that the barrier gate is located between the first gate structure and the second gate structure, and the barrier gate has the second ions; and source-drain doped layers in the second well region and the third well region, respectively.

Another aspect of the present disclosure provides a fabrication method of a semiconductor device, including: providing a substrate; forming a first well region in the substrate, that the first well region has first ions; forming an isolation layer in the first well region; forming a second well region and a third well region in the first well region, that the second well region and the third well region are respectively located on opposite sides of the isolation layer, the second well region and the third well region have second ions, the second ions and the first ions have opposite conductivity types, and a minimum distance of a distance between the second well region and the isolation layer, and a distance between the third well region and the isolation layer, is greater than zero; forming a first gate structure on the second well region and the first well region; forming a second gate structure on the third well region and the first well region; forming a barrier gate on the isolation layer, that the barrier gate is located between the first gate structure and the second gate structure, and the barrier gate has the second ions; and forming source-drain doped layers in the second well region and the third well region, respectively.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
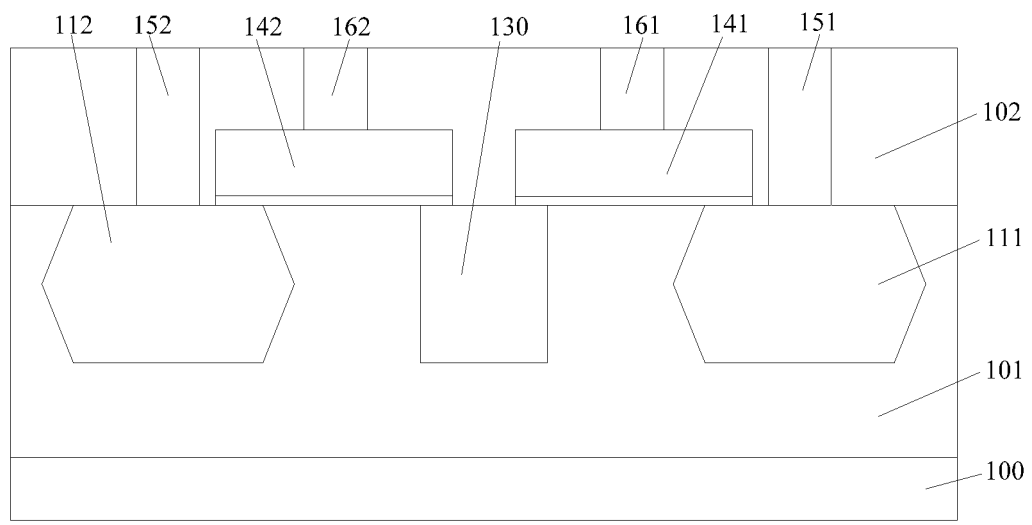
FIG. 1 illustrates a semiconductor device.

FIG. 1 illustrates a semiconductor device, including a substrate 100 having first ions; a first well region 101 in the substrate 100, that the first well region 101 has second ions, and the second ions and the first ions have different conductivity types; an isolation layer 130 in the first well region 101; a second well region 111 and a third well region 112, in the first well region 101, that the second well region 111 and the third well region 112 are located respectively on opposite sides of the isolation layer 130, the second well region 111 and the third well region 112 have the first ions, and a minimum distance of a distance between the isolation layer 130 and the second well region 111, and a distance between the isolation layer 130 and the third well region 112, is greater than zero; a first gate structure 141 and a second gate structure 142 on the first well region 101 and on opposite sides of the isolation layer 130, that the first gate structure 141 covers a portion of a surface of the second well region 111 and a portion of a surface of the isolation layer 130, the second gate structure 142 covers a portion of a surface of the third well region 112 and a portion of a surface of the isolation layer 130, and a portion of the surface of the isolation layer 130 is exposed between the first gate structure 141 and the second gate structure 142; and a dielectric layer 102 on a surface of the first well region 101, that a first source-drain plug 151, a second source-drain plug 152, a first gate plug 161, and a second gate plug 162, are located in the dielectric layer 102, the first source-drain plug 151 is electrically connected to the second well region 111, the second source-drain plug 152 is electrically connected to the third well region 112, the first gate plug 161 is electrically connected to the first gate structure 141, and the second gate plug 162 is electrically connected to the second gate structure 142.

In the above semiconductor device, the first gate structure covers a portion of the surface of the isolation layer 130, and the second gate structure also covers a portion of the surface of the isolation layer 130. When the semiconductor device operates, after bias is applied on the first gate structure or the second gate structure, a depletion region is formed at a bottom of the isolation layer 130. When the bias is applied on the first gate structure, a motion trajectory of a carrier on the first source-drain plug 151 is to enter into the first well region 101 via the second well region 111, bypass the depletion region at the bottom of the isolation layer 130 in the first well region 101, enter the third well region 112, and reach the second source-drain plug 152. Due to existence of the depletion region, the motion trajectory of the carrier is increased. The larger the volume of the depletion region, the longer the motion trajectory of the carrier, and the higher the breakdown voltage of the semiconductor device. The breakdown voltage of the semiconductor device is related to a doped concentration of the second well region 111 and the third well region 112, and a size of the isolation layer 130. But even the doped concentration of the second well region 111 and the third well region 112, and the size of the isolation layer 130 are ideal, increasing of the breakdown voltage of the semiconductor is still limited, which cannot meet actual needs, and thus there is a need to improve the performance of the semiconductor device.

In the present disclosure, a barrier gate is formed between a first gate structure and a second gate structure, that the barrier gate has second ions, and the barrier gate and an isolation layer form a field plate structure, so that a volume of a depletion region at a bottom of the isolation layer is increased, thereby increasing the breakdown voltage of a semiconductor device, which improves the performance of the semiconductor device.

The above described objects, features and advantages of the present disclosure may become easier to be understood from the embodiments of the present disclosure described in detail below with reference to the accompanying drawings.

FIGS. 2 to 7 illustrate structures corresponding to certain stages during an exemplary fabrication process of a semiconductor device consistent with various disclosed embodiments of the present disclosure.

Figure 8:
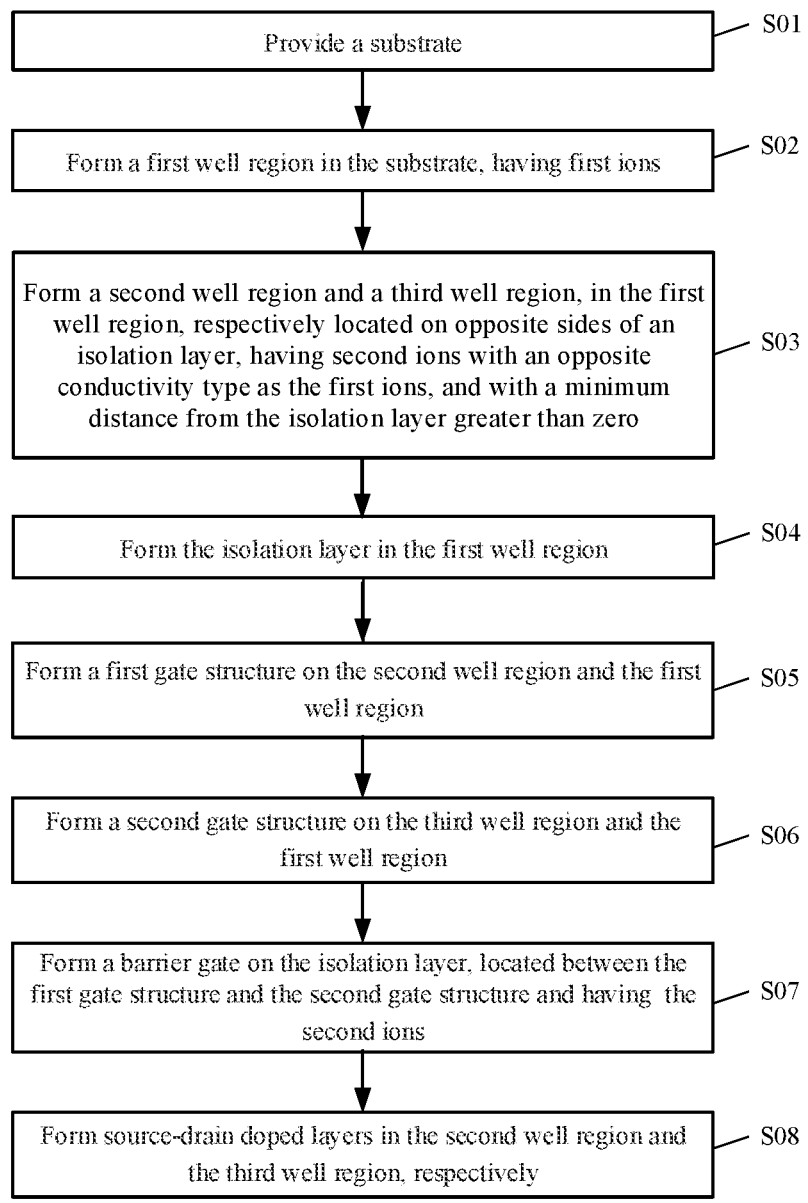
FIG. 8 illustrates an exemplary fabrication process of a semiconductor device consistent with various disclosed embodiments of the present disclosure.

FIG. 8 illustrates an exemplary fabrication process of a semiconductor device consistent with various disclosed embodiments of the present disclosure.

Figure 2:
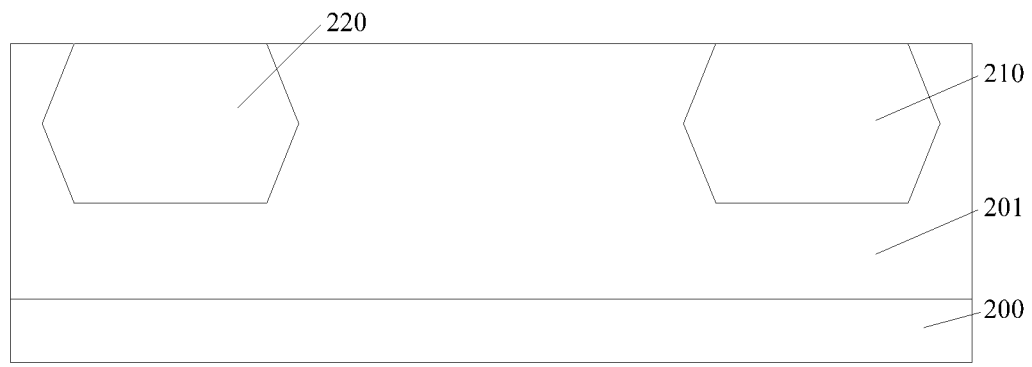
FIGS. 2 to 7 illustrate structures corresponding to certain stages during an exemplary fabrication process of a semiconductor device consistent with various disclosed embodiments of the present disclosure.

Referring to FIG. 2, a substrate 200 is provided, according to S01 in FIG. 8.

In one embodiment, the substrate 200 is a planar semiconductor substrate.

In other embodiments, the substrate 200 includes a semiconductor substrate and fins on the semiconductor substrate.

In one embodiment, the substrate 200 is made of monocrystalline silicon. The substrate 200 may also be made of one of polysilicon and amorphous silicon. The substrate 200 may also be made of a semiconductor material such as one of germanium, silicon germanium, gallium arsenide, and the like.

A first well region 201 is formed in the substrate 200, and the first well region 201 has first ions, according to S02 in FIG. 8.

A process of forming the first well region 201 includes one of a solid source doping process and an ion implantation process.

In one embodiment, the process of forming the first well region 201 is the ion implantation process. A method of forming the first well region 201 includes: performing a first well implant on the substrate 200, that implanted ions of the first well implant are the first ions, to form the first well region 201 in the substrate 200.

A type of the first ions is related to a type of a device to be formed.

When the semiconductor device is an N-type device, the first ions are N-type ions, and the first ions include one of phosphorus ions, arsenic ions, and cerium ions.

When the semiconductor device is a P-type device, the first ions are P-type ions, and the first ions include one of boron ions, $BF^{2-}$ ions, and indium ions.

In one embodiment, the semiconductor device is an N-type device, and the first ions are phosphorus ions.

Next, an isolation layer 230 is formed in the first well region 201, and a second well region 210 and a third well region 220 are formed in the first well region 201. The second well region 210 and the third well region 220 are respectively located on opposite sides of the isolation layer 230, the second well region 210 and the third well region 220 have second ions, the second ions and the first ions have different conductivity types, and a minimum distance of a distance between the second well region 210 and the isolation layer 230, and a distance between the third well region 220 and the isolation layer 230, is greater than zero.

In other embodiments, after the isolation layer 230 is formed, the second well region 210 and the third well region 220 are formed.

In one embodiment, after the second well region 210 and the third well region 220 are formed, the isolation layer 230 is formed, according to S03 and S04 in FIG. 8.

A method of forming the second well region 210 and the third well region 220 includes: forming a patterned mask layer (not shown) on the substrate 200, that the patterned mask layer exposes a portion of a top surface of the first well region 201; and by using the patterned mask layer as a mask, performing a second well implant on the first well region 201 exposed by the patterned mask layer, that implanted ions of the second well implant are the second ions, and the second ions and the first ions have opposite conductivity types, to form the second well region 210 and the third well region 220.

When the semiconductor device is an N-type device, the second ions are P-type ions, and the second ions include one of boron ions, $BF^2$ ions, and indium ions.

When the semiconductor device is a P-type device, the second ions are N-type ions, and the second ions include one of phosphorus ions, arsenic ions, and strontium ions.

In one embodiment, the semiconductor device is an N-type device, and the second ions are boron ions.

Figure 3:
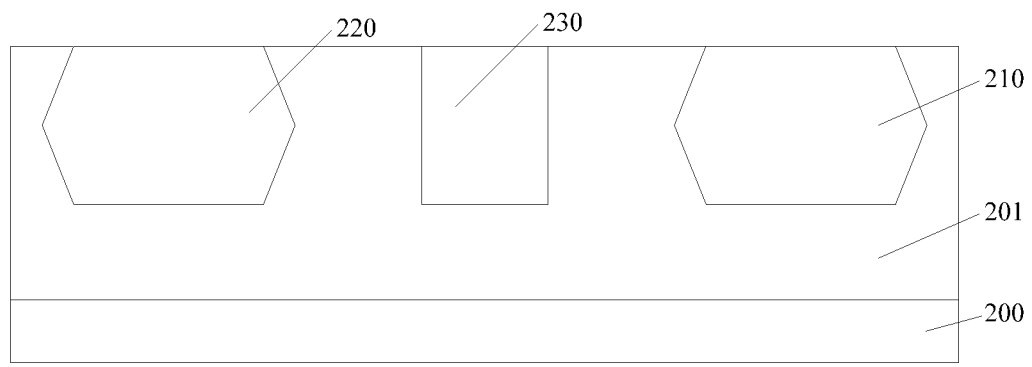

Referring to FIG. 3, the isolation layer 230 is formed in the first well region 201.

The isolation layer 230 is located between the second well region 210 and the third well region 220, the distance between the isolation layer 230 and the second well region 210 is equal to the distance between the isolation layer 230 and the third well region 210, and the minimum distance of the distance between the isolation layer 230 and the second well region 210, and the distance between the isolation layer 230 and the third well region 220, is greater than zero.

A method of forming the isolation layer 230 includes: forming a patterned layer on the substrate 200, that the patterned layer exposes a portion of a surface of the first well region 201; by using the patterned layer as a mask, etching the first well region 201, to form a trench in the first well region 201; forming an initial isolation layer on the surface of the substrate 200 and in the trench; and planarizing the initial isolation layer until a top surface of the substrate 200 is exposed, to form the isolation layer 230 in the trench.

A depth of the trench determines a thickness of the isolation layer 230. The thickness of the isolation layer 230 determines a length of a carrier motion trajectory to some extent. The longer the carrier motion trajectory is, the larger the resistance is, and the larger the voltage division is, which affects the breakdown voltage of the semiconductor device to be formed.

In one embodiment, the isolation layer 230 has a thickness of about 2000 Å to about 2500 Å.

In a case where a width of the isolation layer 230 is constant, the thickness of the isolation layer 230 is too thick, and a depth of the first well region 201 is also too deep. A too deep first well region 201 can cause process waste. The thickness of the isolation layer 230 is too thin, a voltage division is small, and the breakdown voltage of the formed semiconductor device is small.

The second well region 210, the isolation layer 230, and the third well region 220 are arranged in a first direction, and the width of the isolation layer 230 in the first direction is about 0.2 μm to about 0.3 μm.

According to S05 in FIG. 8, a first gate structure is formed on the first well region 201 and the second well region 210, and the first gate structure further extends onto the isolation layer 230. According to S06 in FIG. 8, a second gate structure is formed on the first well region 201 and the third well region 220, and the second gate structure further extends onto the isolation layer 230. According to S07 in FIG. 8, a barrier gate is formed on the isolation layer 230, that the barrier gate is located between the first gate structure and the second gate structure, and the barrier gate has the second ions.

The first gate structure includes a first gate oxide layer and a first gate layer on a surface of the first gate oxide layer.

The second gate structure includes a second gate oxide layer and a second gate layer on a surface of the second gate oxide layer.

In one embodiment, the first gate layer and the second gate layer have the first ions.

In other embodiments, the barrier gate is not connected to the first gate structure and the second gate structure.

The barrier gate is connected to one or both of the first gate structure and the second gate structure.

Figure 4:
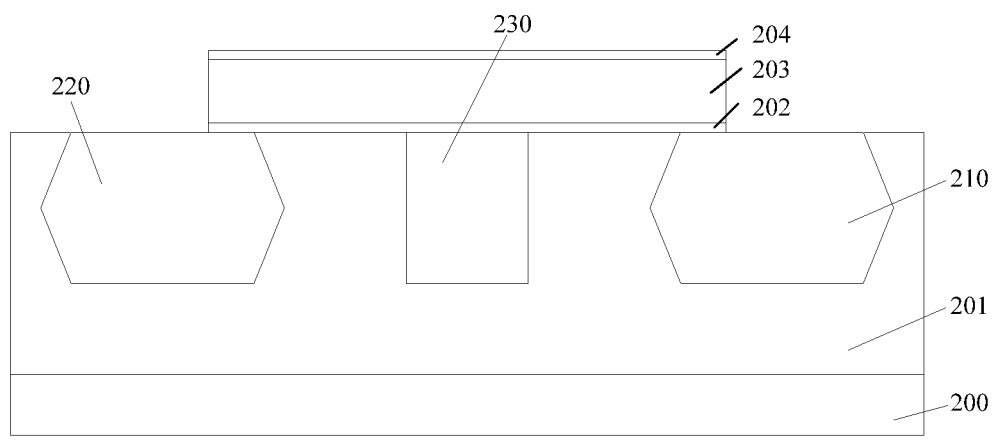
Figure 5:
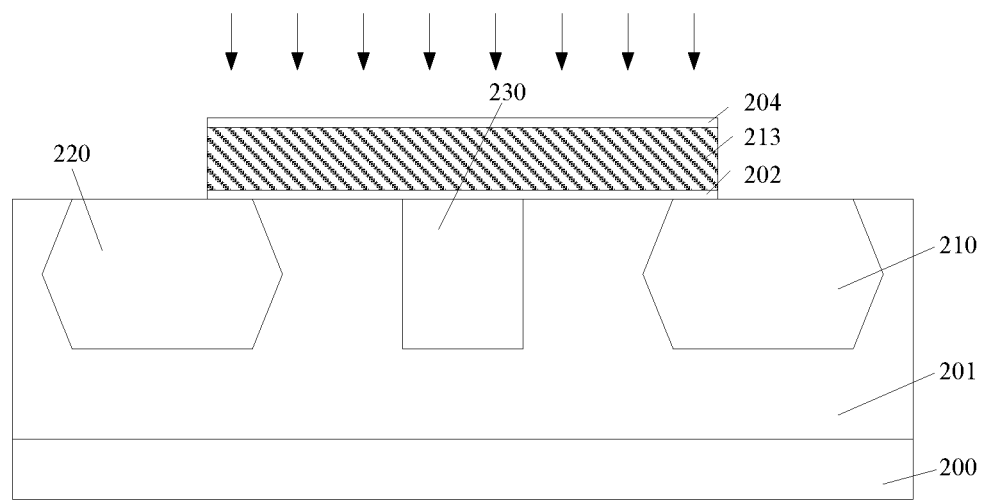
Figure 6:
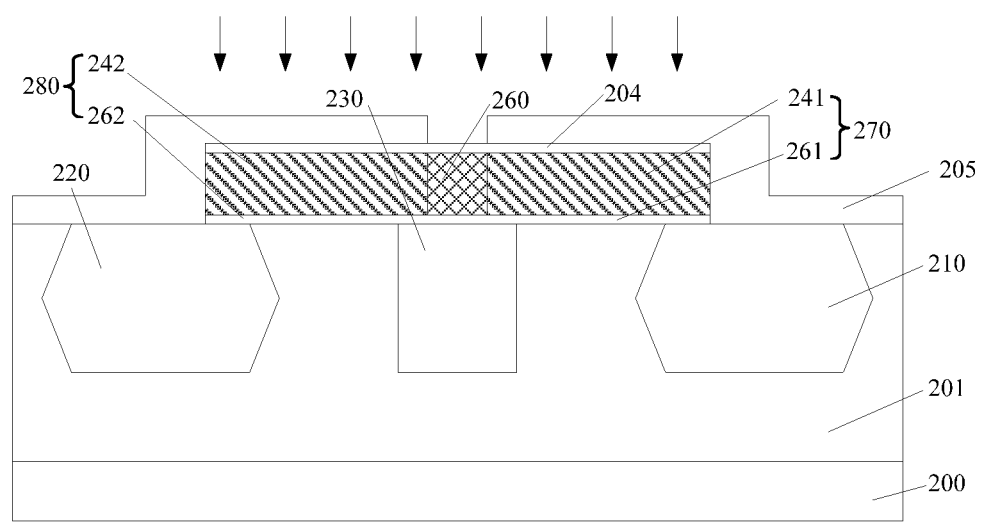

In one embodiment, the barrier gate is connected to both of the first gate structure and the second gate structure. The barrier gate is connected to the first gate layer and the second gate layer. FIG. 4 to FIG. 6 can be referred to for a method of forming the first gate structure, the second gate structure, and the barrier gate.

Referring to FIG. 4, an initial gate structure is formed on the first well region 201. The initial gate structure includes an initial gate oxide layer 202 and an initial gate layer 203 on a surface of the initial gate oxide layer 202, the initial gate oxide layer 202 covers a surface of the isolation layer 230, and the initial gate oxide layer also extends to the second well region 210 and the third well region 220, covering a portion of a surface of the second well region 210 and a portion of a surface of the third well region 220.

The initial gate structure provides a material layer for subsequently forming the first gate structure, the second gate structure, and the barrier gate.

The initial gate oxide layer 202 is made of silicon oxide.

The initial gate layer 203 is made of polysilicon.

In one embodiment, the method further includes forming an initial gate protection layer 204 on a surface of the initial gate layer 203, and the initial gate protection layer 204 is made of one of silicon oxide and silicon nitride.

In one embodiment, the method further includes forming sidewall spacers (not shown) on sidewalls of the initial gate structure, and the sidewalls are used to protect the initial gate layer.

A method of forming the initial gate structure includes: forming an initial gate structure material film on the substrate 200, that the initial gate structure material film includes an initial gate oxide film and an initial gate film on a surface of the initial gate oxide film, and the initial gate oxide film covers the first well region 201, the second well region 210, the third well region 220, and the isolation layer 230; and etching a portion of the initial gate structure material film to expose a portion of a surface of the first well region 201, a portion of a surface of the second well region 210, and a portion of a surface of the third well region 220, to form the initial gate structure.

Referring to FIG. 5, the initial gate layer 203 is ion doped, with the first ions as doping ions, to form a doped gate layer 213.

A process of ion doping the initial gate layer 203 includes one of a solid source doping process and an ion implantation process.

In one embodiment, the process of ion doping the initial gate layer 203 is the ion implantation process.

The doped gate layer 213 provides a material layer for subsequently forming the first gate structure and the second gate structure.

In other embodiments, after forming the doped gate layer 213, the method further includes annealing the doped gate layer 213 to activate the doping ions in the doped gate layer 213.

In one embodiment, the doped gate layer 213 is not annealed.

Referring to FIG. 6, a mask layer 205 is formed on the substrate 200 and the doped gate layer 213. The mask layer 205 covers a portion of a surface of the first well region 201, a portion of a surface of the second well region 210, a portion of a surface of the third well region 220, and a portion of the doped gate layer 213, and exposes a portion of the doped gate layer 213 on the isolation layer 230. The doped gate layer 213 is ion implanted with the second ions by using the mask layer 205 as a mask, forming a barrier gate 260, a first gate structure 270, and a second gate structure 280. The barrier gate 260 is located between the first gate structure 270 and the second gate structure 280. The barrier gate 260 has the second ions.

In some cases, when the entire region of the barrier gate 260 defined by the mask layer 205 is implanted uniformly with the second ions, and the barrier gate 260 is considered as being connected with each of the first and second gate structures 270/280. PN junctions may be formed between the barrier gate 260 and the first gate structure 270 and between the barrier gate 260 and the second gate structure 280. In other cases, the implantation of the second ions in the barrier gate 260 may be controlled such that a PN junction is formed either between the barrier gate 260 and the first gate structure 270 or between the barrier gate 260 and the second gate structure 280.

The mask layer 205 is made of photoresist.

After the barrier gate 260 is formed, the method further includes removing the mask layer 205, and a process of removing the mask layer 205 is an ashing process.

In one embodiment, the second ions are P-type ions, and the second ions include one of boron ions, $BF^{2-}$ ions, and indium ions.

In one embodiment, parameters of the ion implantation include: implanted ions as one of B ions and $BF^{2-}$ ions, an implantation energy ranging from about 20 KeV to about 25 KeV, and an implantation concentration ranging from about 1.5E15 atom/$cm^3$ to about 2.0E15 atom/$cm^3$.

The first gate structure 270 includes a first gate oxide layer 261 and a first gate layer 241 on a surface of the first gate oxide layer 261.

In one embodiment, the first gate oxide layer 261 is the initial gate oxide layer 202 on a surface of the substrate 200 between the barrier gate 260 and a sidewall of the dielectric layer 206 above the second well region 210, and the first gate layer 241 is the doped gate layer 213 between the barrier gate 260 and the sidewall of the dielectric layer 206 above the second well region 210. In the embodiment that sidewall spacers (not shown) are formed on sidewalls of the initial gate structure, the first gate oxide layer 261 is the initial gate oxide layer 202 on a surface of the substrate 200 between the barrier gate 260 and the sidewall spacer above the second well region 210, and the first gate layer 241 is the doped gate layer 213 between the barrier gate 260 and the sidewall spacer above the second well region 210.

The first gate oxide layer 261 covers a portion of a surface of the isolation layer 230, a portion of a surface of the second well region 210, and a surface of the first well region 201 between the isolation layer 230 and the second well region 210.

The second gate structure 280 includes a second gate oxide layer 262 and a second gate layer 242 on a surface of the second gate oxide layer 262.

In one embodiment, the second gate oxide layer 262 is the initial gate oxide layer 202 on the surface of the substrate 200 between the barrier gate 260 and a sidewall of the dielectric layer 206 above the third well region 220, and the second gate layer 242 is the doped gate layer 213 between the barrier gate 260 and the sidewall of the dielectric layer 206 above the third well region 220. In the embodiment that sidewall spacers (not shown) are formed on sidewalls of the initial gate structure, the second gate oxide layer 262 is the initial gate oxide layer 202 on the surface of the substrate 200 between the barrier gate 260 and the sidewall spacer above the third well region 220, and the second gate layer 242 is the doped gate layer 213 between the barrier gate 260 and the sidewall spacer above the third well region 220.

The second gate oxide layer 262 covers a portion of a surface of the isolation layer 230, a portion of a surface of the third well region 220, and a surface of the first well region 201 between the isolation layer 230 and the third well region 220.

The barrier gate 260 is connected to the first gate layer 241 and the second gate layer 242.

The first gate layer 241 and the second gate layer 242 have a different ion conductivity type from the barrier gate 260, and the barrier gate 260 forms PN junctions with the first gate layer 241 and the second gate layer 242 to realize isolation between the barrier gate 260 and the first gate structure 270 or between the barrier gate 260 and the second gate structure 280, thereby avoiding effect of an energized first gate structure 270 or an energized second gate structure 280 on an electric field of the barrier gate 260.

The second well region 210, the isolation layer 230, and the third well region 220 are arranged in the first direction, and a width of the barrier gate 260 in the first direction is about 0.2 μm to about 0.3 μm.

If the width of the barrier gate 260 is too small, a field plate formed has a limited effect, an effect of increasing the depletion region is limited, and an effect of increasing the breakdown voltage of the semiconductor device is not good. If the width of the barrier gate 260 is too large, a distance between the first gate structure and the second gate structure is large, and a volume of the semiconductor device is large, which does not conform to a trend of device miniaturization.

The barrier gate 260 is formed between the first gate structure 270 and the second gate structure 280. The barrier gate 260 has the second ions. The barrier gate 260 and the isolation layer 230 form a field plate structure, and a volume of a depletion region in the first well region 201 below the isolation layer 230 is increased. After bias is applied on the first gate structure 270 or the second gate structure 280, a voltage is applied to source-drain doped layers 250, and a motion trajectory of a carrier needs to bypass the depletion region at a bottom of the isolation layer 230. The volume of the depletion region at the bottom of the isolation layer 230 becomes larger, the carrier motion trajectory becomes longer, the resistance of the semiconductor device becomes higher, and the withstand voltage of the semiconductor device increases, thereby making the breakdown voltage of the semiconductor device larger, so that the performance of the semiconductor device is improved.

The barrier gate 260, the first gate structure 270, and the second gate structure 280 are formed by ion doping and ion implantation on a basis of the initial gate structure, and the method is simple and the process flow is less.

Figure 7:
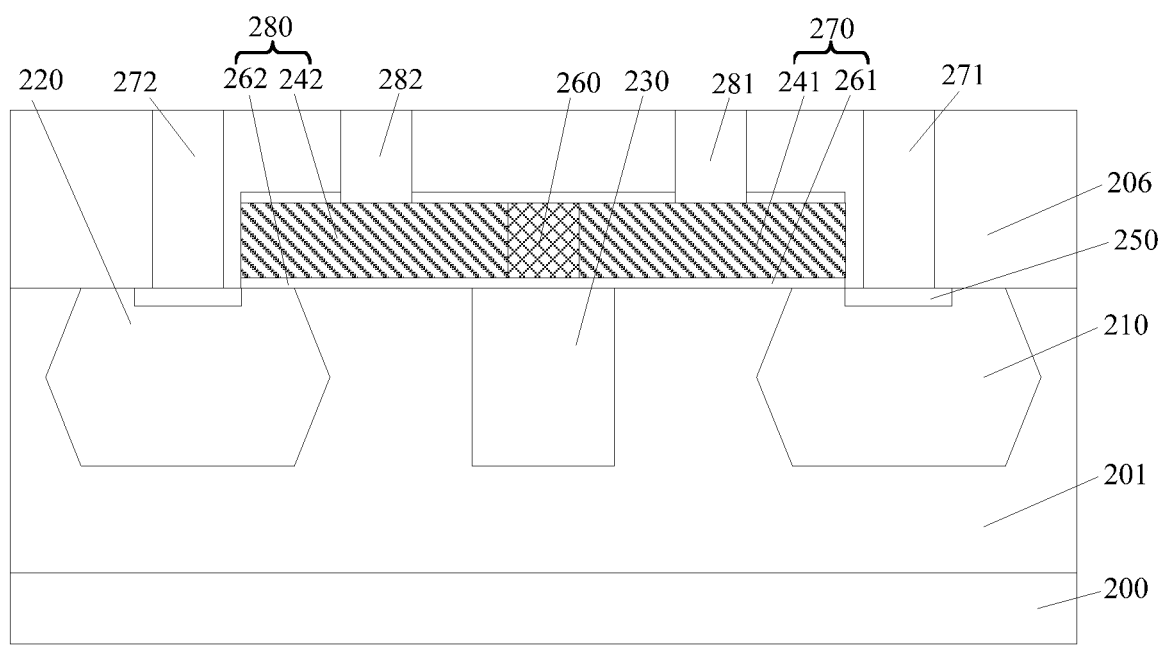

Referring to FIG. 7, the source-drain doped layers 250 are formed in the second well region 210 and the third well region 220, respectively, according to S08 in FIG. 8.

A method for forming the source-drain doped layers 250 includes: performing source-drain-doping ion implantation on the second well region 210 and the third well region 220, that implanted ions of the source-drain-doping ion implantation are the first ions.

In one embodiment, the first ions are N-type ions.

In other embodiments, the first ions are P-type ions.

After the source-drain doped layers 250 are formed, a dielectric layer 206 is formed on the substrate 200, and the dielectric layer 206 covers the first gate structure 270, the second gate structure 280, and the barrier gate. A first source-drain plug 271, a second source-drain plug 272, a first gate plug 281, and a second gate plug 282, are formed in the dielectric layer 206. The first source-drain plug 271 is electrically connected to the second well region 210, the second source-drain plug 272 is electrically connected to the third well region 220, the first gate plug 281 is electrically connected to the first gate structure 270, and the second gate plug 282 is electrically connected to the second gate structure 280.

The dielectric layer 206 covers a portion of a surface of the first well region 201, a portion of a surface of the second well region 210, and a portion of a surface of the third well region 220.

The first gate plug 281 is electrically connected to the first gate layer 241 of the first gate structure 270.

The second gate plug 282 is electrically connected to the second gate layer 242 of the second gate structure 280.

The first source-drain plug 271 is electrically connected to a source-drain doped layer 250 in the second well region 210, and the second source-drain plug 272 is electrically connected to a source-drain doped layer 250 in the third well region 220.

Correspondingly, one embodiment further provides a semiconductor device formed by the above method. Referring to FIG. 7, the semiconductor device includes: a substrate 200; a first well region 201 in the substrate 200, that the first well region 201 has first ions; an isolation layer 230 in the first well region 201; a second well region 210 and a third well region 220, formed in the first well region 201, that the second well region 210 and the third well region 220 are respectively located on opposite sides of the isolation layer 230, the second well region 210 and the third well region 220 have second ions, the second ions and the first ions have opposite conductivity types, and a minimum distance of a distance between the second well region 210 and the isolation layer 230, and a distance between the third well region 220 and the isolation layer 230, is greater than zero; a first gate structure 270 on the first well region 201 and the second well region 210; a second gate structure 280 on the first well region 201 and the third well region 220; a barrier gate 260 on the isolation layer 230, that the barrier gate 260 is located between the first gate structure 270 and the second gate structure 280, and the barrier gate 260 has the second ions; and source-drain doped layers 250 in the second well region 210 and the third well region 220, respectively.

The distance between the isolation layer 230 and the second well region 210 is equal to the distance between the isolation layer 230 and the third well region 220.

The first gate structure 270 includes a first gate oxide layer 261 and a first gate layer 241 on a surface of the first gate oxide layer 261, and the second gate structure 280 includes a second gate oxide layer 262 and a second gate layer 242 on a surface of the second gate oxide layer 262.

The first gate layer 241 and the second gate layer 242 are made of polysilicon, and the first gate layer 241 and the second gate layer 242 have the first ions.

The first gate structure 270 also extends onto the isolation layer 230. The second gate structure 280 also extends onto the isolation layer 230.

The barrier gate 260 is connected to one or both of the first gate structure 270 and the second gate structure 280.

When the semiconductor device is an N-type device, the first ions are N-type ions and the second ions are P-type ions. When the semiconductor device is a P-type device, the first ions are P-type ions and the second ions are N-type ions.

The isolation layer 230 has a thickness of about 2000 Å to about 2500 Å.

The barrier gate 260 is located on the isolation layer 230. The barrier gate 260 has the second ions. The barrier gate 260 and the isolation layer 230 form a field plate structure, which increases a volume of a depletion region in the first well region 201 below the isolation layer 230. After bias is applied on the first gate structure 270 or the second gate structure 280, a voltage is applied to the source-drain doped layers 250, a motion trajectory of a carrier needs to bypass the depletion region at a bottom of the isolation layer 230. The volume of the depletion region at the bottom of the isolation layer 230 becomes larger, the carrier motion trajectory becomes longer, the resistance of the semiconductor device becomes higher, and the withstand voltage of the semiconductor device increases, thereby making the breakdown voltage of the semiconductor device larger, so that the performance of the semiconductor device is improved.

Compared to the conventional method, the technical solution of the embodiments of the present disclosure has the following beneficial effects.

In a semiconductor device provided by the present disclosure, a barrier gate is located on an isolation layer, second ions are disposed in the barrier gate, and the barrier gate and the isolation layer form a field plate structure, which increases a volume of a depletion region in a first well region below the isolation layer. After bias is applied on a first gate structure or a second gate structure, a voltage is applied to source-drain doped layers, and a motion trajectory of a carrier needs to bypass the depletion region at a bottom of the isolation layer. The volume of the depletion region at the bottom of the isolation layer becomes larger, the carrier motion trajectory becomes longer, the resistance of the semiconductor device becomes higher, and the withstand voltage of the semiconductor device increases, thereby making the breakdown voltage of the semiconductor device larger, so that the performance of the semiconductor device is improved.

In a fabrication method of a semiconductor device provided by the present disclosure, a barrier gate is formed between a first gate structure and a second gate structure, the barrier gate has second ions, and the barrier gate and an isolation layer form a field plate structure, which increases a volume of a depletion region in a first well region below the isolation layer. After bias is applied on the first gate structure or the second gate structure, a voltage is applied to source-drain doped layers, and a motion trajectory of a carrier needs to bypass the depletion region at a bottom of the isolation layer. The volume of the depletion region at the bottom of the isolation layer becomes larger, the resistance of the semiconductor device becomes higher, and the withstand voltage of the semiconductor device increases, thereby making the breakdown voltage of the semiconductor device larger, so that the performance of the semiconductor device is improved.

Further, the barrier gate, the first gate structure, and the second gate structure are formed by ion doping and ion implantation on a basis of an initial gate structure, the method is simple and the process flow is less. The first gate structure and the second gate structure have a different ion conductivity type compared to the barrier gate, and PN junctions are formed between the barrier gate and the first gate structure or the second gate structure, thereby realizing isolation between the barrier gate and the first gate structure or the second gate structure, and avoiding impact on the barrier gate electric field when the first gate structure or the second gate structure is energized.

The embodiments disclosed herein are exemplary only. Other applications, advantages, alternations, modifications, or equivalents to the disclosed embodiments that are obvious to those skilled in the art are intended to be encompassed within the scope of the present disclosure.

What is claimed is:

1. A semiconductor device, comprising:
a substrate;
a first well region in the substrate, wherein the first well region has first ions;
an isolation layer in the first well region;
a second well region and a third well region, formed in the first well region, wherein the second well region and the third well region are respectively located on opposite sides of the isolation layer, the second well region and the third well region have second ions, the second ions and the first ions have opposite conductivity types, and a minimum distance of a distance between the second well region and the isolation layer, and a distance between the third well region and the isolation layer, is greater than zero;
a first gate structure, on the second well region and the first well region;
a second gate structure, on the third well region and the first well region;
a third gate structure on the isolation layer, wherein the third gate structure is located between the first gate structure and the second gate structure, the first gate structure, the second gate structure, and the third gate structure are located over the substrate, and the third gate structure has the second ions; and
source-drain doped layers in the second well region and the third well region, respectively.

2. The device according to claim 1, wherein:
the distance between the second well region and the isolation layer is equal to the distance between the third well region and the isolation layer.

3. The device according to claim 1, wherein:
the first gate structure includes a first gate oxide layer and a first gate layer on a surface of the first gate oxide layer, and the second gate structure includes a second gate oxide layer and a second gate layer on a surface of the second gate oxide layer.

4. The device according to claim 3, wherein
the first gate layer and the second gate layer are made of polysilicon, and the first gate layer and the second gate layer have the first ions.

5. The device according to claim 1, wherein:
the first gate structure further extends to the isolation layer.

6. The device according to claim 5, wherein:
the second gate structure further extends to the isolation layer.

7. The device according to claim 1, wherein:
the third gate structure is connected to one or both of the first gate structure and the second gate structure.

8. The device according to claim 1, wherein:
when the device is an N-type device, the first ions are N-type ions, and the second ions are P-type ions; and
when the device is a P-type device, the first ions are P-type ions, and the second ions are N-type ions.

9. The device according to claim 1, wherein:
a thickness of the isolation layer is about 2000 Å to about 2500 Å.

10. The device according to claim 1, wherein:
the second well region, the isolation layer, and the third well region are arranged in a first direction, and a width of the isolation layer in the first direction is about 0.2 μm to about 0.3 μm.

11. The device according to claim 1, wherein:
the second well region, the isolation layer, and the third well region are arranged in the first direction, and a width of the third gate structure in the first direction is about 0.2 μm to about 0.3 μm.

12. The device according to claim 1, wherein:
a first PN junction is formed between the third gate structure and the first gate, and
a second PN junction is formed between the third gate structure and the second gate.

* * * * *